United States Patent
Sato (10) Patent No.: US 10,661,315 B2
(45) Date of Patent: May 26, 2020

(54) SUBSTRATE LIQUID PROCESSING APPARATUS, SUBSTRATE LIQUID PROCESSING METHOD, AND COMPUTER-READABLE STORAGE MEDIUM HAVING SUBSTRATE LIQUID PROCESSING PROGRAM STORED THEREON

(71) Applicant: Tokyo Electron Limited, Tokyo (JP)

(72) Inventor: Hideaki Sato, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 349 days.

(21) Appl. No.: 15/061,035

(22) Filed: Mar. 4, 2016

(65) Prior Publication Data

US 2016/0271657 A1 Sep. 22, 2016

(30) Foreign Application Priority Data

Mar. 19, 2015 (JP) ................ 2015-055809

(51) Int. Cl.
*H01L 21/67* (2006.01)
*B08B 9/032* (2006.01)
*B08B 3/10* (2006.01)

(52) U.S. Cl.
CPC ............ *B08B 9/0321* (2013.01); *B08B 3/10* (2013.01); *H01L 21/67057* (2013.01); *H01L 21/67248* (2013.01); *H01L 21/67253* (2013.01)

(58) Field of Classification Search
CPC ......... H01L 21/67023; H01L 21/67057; H01L 21/0241; H01L 21/2052; H01L 21/67248; H01L 21/67253; B08B 3/10
See application file for complete search history.

(56) References Cited

U.S. PATENT DOCUMENTS 6,866,051 B1 * 3/2005 Nickhou ............... B08B 3/12
134/137
2007/0175387 A1 * 8/2007 Kimura ............ H01L 21/67057
118/429

(Continued)

FOREIGN PATENT DOCUMENTS

EP 1139389 A 10/2001
JP 09-199468 A 7/1997

(Continued)

OTHER PUBLICATIONS

JPH09199468—Machine Translation (Year: 1997).*
JP2013232593—Machine Translation (Year: 2013).*

*Primary Examiner* — Marc Lorenzi
(74) *Attorney, Agent, or Firm* — Abelman, Frayne & Schwab (57) ABSTRACT

Provided is a substrate liquid processing apparatus includes a processing liquid flow path through which a processing liquid flows; a cleaning fluid supply unit that supplies a cleaning fluid into the processing liquid flow path to thereby clean at least a part of the processing liquid flow path; a heater that heats the processing liquid; and a controller that controls the cleaning fluid supply unit and the heater. The controller controls the heater to heat the processing liquid to a temperature higher than a temperature at which crystallization is caused by a reaction between the processing liquid and the cleaning fluid, such that the heated processing liquid is supplied into the processing liquid flow path which retains the processing liquid of the temperature at which crystallization is caused by the reaction, and then controls the cleaning fluid supply unit to supply the cleaning fluid into the processing liquid flow path.

5 Claims, 7 Drawing Sheets

(56) References Cited

U.S. PATENT DOCUMENTS

| | | | | |
|---|---|---|---|---|
| 2008/0196742 A1* | 8/2008 | Beck | ....................... | C11D 3/06 |
| | | | | 134/1.3 |
| 2013/0255882 A1* | 10/2013 | Takahashi | ......... | H01L 21/30604 |
| | | | | 156/345.15 |
| 2017/0287744 A1* | 10/2017 | Kobayashi | .......... | H01L 21/6704 |

FOREIGN PATENT DOCUMENTS

| JP | 2013-206946 A | | 10/2013 | | |
|---|---|---|---|---|---|
| JP | 2013232593 A | * | 11/2013 | ........ | H01L 21/31111 |

* cited by examiner

SUBSTRATE LIQUID PROCESSING APPARATUS, SUBSTRATE LIQUID PROCESSING METHOD, AND COMPUTER-READABLE STORAGE MEDIUM HAVING SUBSTRATE LIQUID PROCESSING PROGRAM STORED THEREON

CROSS-REFERENCE TO RELATED APPLICATIONS

This application is based on and claims priority from Japanese Patent Application No. 2015-055809, filed on Mar. 19, 2015, with the Japan Patent Office, the disclosure of which is incorporated herein in its entirety by reference.

TECHNICAL FIELD

The present disclosure relates to a substrate liquid processing apparatus and a substrate liquid processing method for cleaning a processing liquid flow path with a cleaning fluid through which a processing liquid for processing a substrate flows. The present disclosure also relates to a computer-readable storage medium having a substrate liquid processing program stored thereon.

BACKGROUND

In manufacturing, for example, a semiconductor component or a flat panel display (FPD), a substrate liquid processing apparatus is employed to process a substrate such as a semiconductor wafer or a liquid-crystal substrate with a processing liquid such as a cleaning liquid or an etching liquid.

In a conventional substrate liquid processing apparatus, a circulation flow path is connected to a processing liquid storage tank that stores a processing liquid, and a pump and a heater are installed in the middle of the circulation flow path. The pump is driven to allow the processing liquid to flow through the circulation flow path, and the heater heats the processing liquid to a predetermined temperature such that the heated processing liquid returns to the processing liquid storage tank. Then, a substrate is immersed into the processing liquid storage tank that stores the processing liquid at the predetermined temperature, thereby performing a liquid processing on the substrate.

In this substrate liquid processing apparatus, in order to clean a sensor unit of a concentration sensor for measuring the concentration of the processing liquid, deionized water is supplied into the flow path through which the processing liquid flows (circulation flow path) (see, e.g., Japanese Patent Laid-Open Publication No. 09-199468).

SUMMARY

According to the present disclosure, there is provided a substrate liquid processing apparatus including: a processing liquid flow path through which a processing liquid for processing a substrate flows; a cleaning fluid supply unit configured to supply a cleaning fluid into the processing liquid flow path to thereby clean at least a part of the processing liquid flow path; a heater configured to heat the processing liquid; and a controller configured to control the cleaning fluid supply unit and the heater. The controller controls the heater to heat the processing liquid to a temperature higher than a temperature at which crystallization is caused by a reaction between the processing liquid and the cleaning fluid, such that the heated processing liquid is supplied into the processing liquid flow path which retains the processing liquid of the temperature at which crystallization is caused by the reaction between the processing liquid and the cleaning fluid, and then controls the cleaning fluid supply unit to supply the cleaning fluid into the processing liquid flow path.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

In the conventional substrate liquid processing apparatus, the concentration sensor is often cleaned in a certain period of time after the substrate is processed with the processing liquid, leading to decrease in the temperature of the processing liquid remaining in the processing liquid flow path. In addition, when a cleaning fluid at the room temperature is supplied into the circulation flow path that retains the processing liquid at a decreased temperature, the processing liquid and the cleaning fluid may react with each other to produce crystals.

Once crystals are produced in the circulation flow path, the cleaning cannot be sufficiently performed. In addition, the crystals may result in particles which are attached to the substrate or block the flow path. Therefore, the substrate may not be sufficiently processed.

According to one aspect, the present disclosure provides a substrate liquid processing apparatus including: a processing liquid flow path through which a processing liquid for processing a substrate flows; a cleaning fluid supply unit configured to supply a cleaning fluid into the processing liquid flow path to thereby clean at least a part of the processing liquid flow path; a heater configured to heat the processing liquid; and a controller configured to control the cleaning fluid supply unit and the heater. The controller controls the heater to heat the processing liquid to a temperature higher than a temperature at which crystallization is caused by a reaction between the processing liquid and the cleaning fluid, such that the heated processing liquid is supplied into the processing liquid flow path which retains the processing liquid of the temperature at which crystallization is caused by the reaction between the processing liquid and the cleaning fluid, and then controls the cleaning fluid supply unit to supply the cleaning fluid into the processing liquid flow path.

According to another aspect, the present disclosure provides a substrate liquid processing apparatus including: a processing liquid flow path through which a processing liquid for processing a substrate flows; a cleaning fluid supply unit configured to supply a cleaning fluid into the processing liquid flow path to thereby clean at least a part of the processing liquid flow path; a heater configured to heat the cleaning fluid; and a controller configured to control the cleaning fluid supply unit and the heater, wherein the controller controls the heater to heat the cleaning fluid to a temperature higher than a temperature at which crystallization is caused by a reaction between the processing liquid and the cleaning fluid, and then controls the cleaning fluid supply unit to supply the heated cleaning fluid is supplied into the processing liquid flow path which retains the processing liquid of the temperature at which crystallization is caused by the reaction between the processing liquid and the cleaning fluid.

The apparatus further includes a temperature sensor configured to measure a temperature of the processing liquid or the cleaning fluid. When the temperature measured by the temperature sensor is lower than a predetermined temperature, the controller controls the heater to heat the processing liquid or the cleaning fluid.

The apparatus further includes a timer configured to measure a period of time for which the processing liquid is retained in the processing liquid flow path. When the period of time measured by the timer is longer than a predetermined period of time, the controller controls the heater to heat the processing liquid or the cleaning fluid.

The controller controls the heater to heat the processing liquid to a temperature of the processing liquid for processing the substrate.

The cleaning fluid supply unit supplies a cleaning fluid for cleaning a concentration sensor installed in the processing liquid flow path.

The processing liquid flow path includes: a circulation flow path connected to a processing liquid storage tank that stores the processing liquid and configured to circulate the processing liquid, and a concentration measurement flow path branched from the circulation flow path and configured to measure a concentration of the processing liquid. The heater is installed in the circulation flow path.

According to still another aspect, the present disclosure provides a substrate liquid processing method for supplying a cleaning fluid into a processing liquid flow path through which a processing liquid for processing a substrate flows to clean at least a part of the processing liquid flow path. The method includes: heating the processing liquid to a temperature higher than a temperature at which crystallization is caused by a reaction between the processing liquid and the cleaning fluid such that the heated processing liquid is supplied into the processing liquid flow path which retains the processing liquid of the temperature at which crystallization is caused by the reaction between the processing liquid and the cleaning fluid; and supplying the cleaning fluid into the processing flow path.

According to yet another aspect, the present disclosure provides a substrate liquid processing method for supplying a cleaning fluid into a processing liquid flow path through which a processing liquid for processing a substrate flows to clean at least a part of the processing liquid flow path. The method comprising: heating the cleaning fluid to a temperature higher than a temperature at which crystallization is caused by a reaction between the processing liquid and the cleaning fluid; and supplying the cleaning fluid into the processing flow path which retains the processing liquid of the temperature at which crystallization is caused by reaction between the processing liquid and the cleaning fluid.

When a temperature of the processing liquid or the cleaning fluid is lower than a predetermined temperature, the processing liquid is heated.

When a time for which the processing liquid is retained in the processing liquid flow path is longer than a predetermined period of time, the processing liquid is heated or the cleaning fluid.

The processing liquid is heated to a temperature of the processing liquid for processing the substrate.

A cleaning fluid is supplied to clean a concentration sensor installed in the processing liquid flow path.

According to still yet another aspect, the present disclosure provides a non-transitory computer-readable storage medium that stores a substrate liquid processing program executed in a substrate liquid processing apparatus including: a processing liquid flow path through which a processing liquid for processing a substrate flows; a cleaning fluid supply unit configured to supply a cleaning fluid into the processing liquid flow path to clean at least a part of the processing liquid flow path; a heater configured to heat the processing liquid; and a controller configured to control the cleaning fluid supply unit and the heater. The heater heats the processing liquid to a temperature higher than a temperature at which crystallization is caused by a reaction between the processing liquid and the cleaning fluid, such that the heated processing liquid is supplied into the processing liquid flow path which retains a processing liquid of the temperature at which crystallization is caused by the reaction between the processing liquid and the cleaning fluid; and the cleaning fluid supply unit supplies the cleaning fluid into the processing liquid flow path.

According to the present disclosure, it is possible to prevent crystals from being produced by the reaction between the processing liquid and the cleaning fluid at the time of cleaning the processing liquid flow path through which the processing liquid flows. Therefore, the substrate can be sufficiently processed.

Hereinafter, configurations of a substrate liquid processing apparatus, a substrate liquid processing method, and a substrate liquid processing program according to the present disclosure will be described in detail with reference to accompanying drawings.

Figure 1:
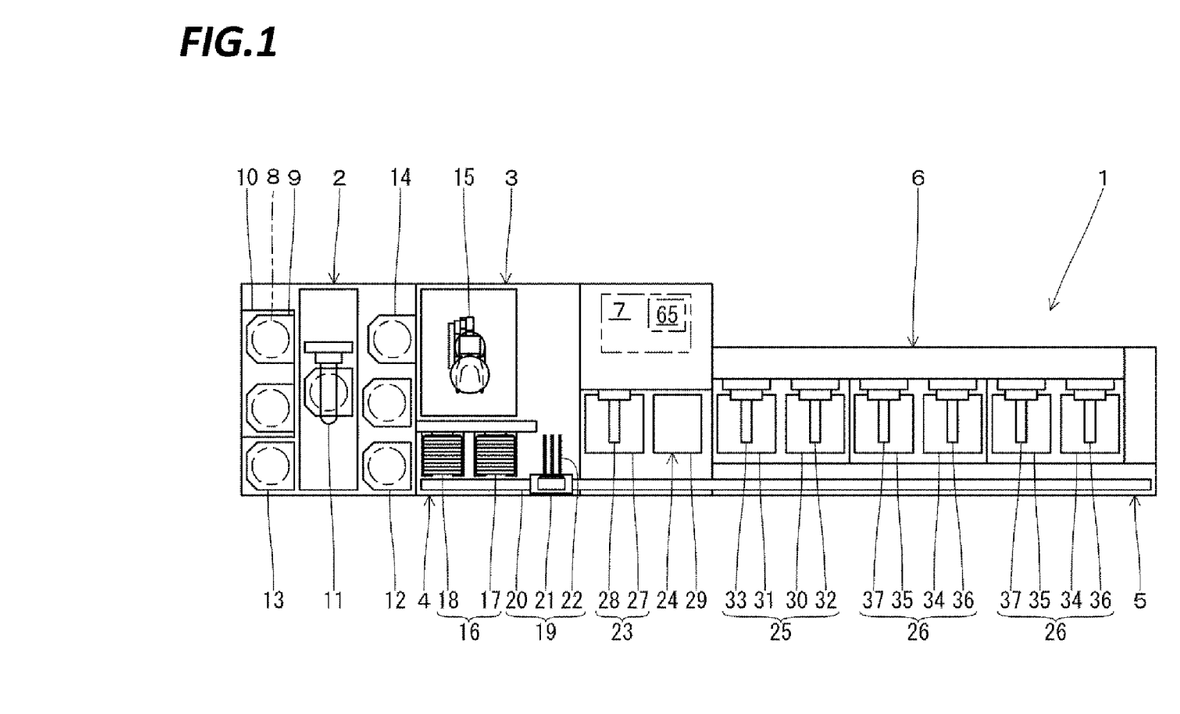
FIG. 1 is an explanatory plan view illustrating a substrate liquid processing apparatus.

As illustrated in FIG. 1, a substrate liquid processing apparatus 1 includes a carrier carrying-in/out section 2, a lot forming section 3, a lot placing section 4, a lot conveying section 5, a lot processing section 6, and a controller 7.

The carrier carrying-in/out section 2 performs a carry-in/out of a carrier 9 that accommodates a plurality of (e.g., twenty-five) substrates (silicon wafers) 8 arranged vertically in a horizontal posture.

The carrier carrying-in/out section 2 includes a carrier stage 10 on which a plurality of carriers 9 are placed, a carrier conveying mechanism 11 that conveys the carriers 9, carrier stocks 12 and 13 that temporarily stores the carriers 9, and a carrier placing table 14 on which the carriers 9 are placed. The carrier stock 12 temporarily stores the substrates 8 to be fabricated as products before they are processed in the lot processing section 6. In addition, the carrier stock 13 temporarily stores the substrates 8 to be fabricated as products after they are processed in the lot processing section 6.

In addition, the carrier carrying-in/out section 2 conveys the carriers 9 carried into the carrier stage 10 from the outside to the carrier stock 12 or the carrier placing table 14 by using the carrier conveying mechanism 11. In addition, the carrier carrying-in/out section 2 conveys the carriers 9 placed on the carrier placing table 14 to the carrier stock 13 or the carrier stage 10 by using the carrier conveying mechanism 11. The carriers 9 conveyed to the carrier stage 10 are carried out to the outside.

The lot forming section 3 combines the substrates 8 accommodated in one or more carriers 9 to form a "lot" composed of a plurality of (e.g., fifty) substrates 8, which will be then processed simultaneously.

The lot forming section 3 is provided with a substrate conveying mechanism 15 to convey the plurality of substrates 8. Further, the substrate conveying mechanism 15 may change the posture of the substrates 8 from the horizontal posture to the vertical posture and vice versa during the conveyance of the substrates 8.

The lot forming section 3 conveys the substrates 8 from the carriers 9 placed on the carrier placing table 14 to the lot placing section 4 by using the substrate conveying mechanism 15, and forms a lot in the lot placing section 4. In addition, the lot forming section 3 conveys the lot placed on the lot placing section 4 to the carriers 9 placed on the carrier placing table 14 by using the substrate conveying mechanism 15. The substrate conveying mechanism 15 serves as a substrate support for supporting the substrates 8, and includes two types of substrate supports, that is, a pre-processed substrate support for supporting the substrates 8 before they are processed (before they are conveyed from the lot conveying section 5), and a post-processed substrate support for supporting the substrates 8 after they are processed (after they are conveyed from the lot conveying section 5). In this manner, particles attached to the pre-processed substrates 8 are suppressed from being shifted and attached to the post-processed substrates 8.

The lot placing section 4 temporarily places (holds) the lot conveyed between the lot forming section 3 and the lot processing section 6 on a lot placing table 16 by the lot conveying section 5.

The lot placing section 4 is provided with a carry-in-side lot placing table 17 on which a lot is placed before it is processed (before it is conveyed from the lot conveying section 5), and a carry-out-side lot placing table 18 on which a lot is placed after it is processed (after it is conveyed from the lot conveying section 5). On each of the carry-in-side lot placing table 17 and the carry-out-side lot placing table 18, a plurality of substrates of one lot are placed back and forth in the vertical posture.

Then, the lot formed in the lot forming section 3 is placed on the carry-in-side lot placing table 17 in the lot placing section 4, and the lot is carried into the lot processing section 6 via the lot conveying section 5. In addition, the lot carried out from the lot processing section 6 via the lot conveying section 5 is placed on the carry-out-side lot placing table 18, and the lot is conveyed to the lot forming section 3.

The lot conveying section 5 conveys the lot between the lot placing section 4 and the lot processing section 6 or inside the lot processing section 6.

The lot conveying section 5 is provided with a lot conveying mechanism 19 to convey the lot. The lot conveying mechanism 19 includes a rail 20 disposed along the lot placing section 4 and the lot processing section 6, and a moving part 21 movable on the rail 20 while holding the plurality of substrates 8. In the moving part 21, a substrate holder 22 is provided to freely advance and retreat so as to hold the plurality of substrates 8 arranged back and forth in the vertical posture.

The lot conveying section 5 receives the lot placed on the carry-in-side lot placing table 17 by the substrate holder 22 of the lot conveying mechanism 19, and delivers the lot to the lot processing section 6. In addition, the lot conveying section 5 receives the lot processed in the lot processing section 6 by the substrate holder 22 of the lot conveying mechanism 19, and delivers the lot to the carry-out-side lot placing table 18. The lot conveying section 5 conveys the lot inside the lot processing section 6 by using the lot conveying method 19.

The lot processing section 6 performs a processing such as etching, cleaning, or drying, lot by lot, each including a plurality of substrates 8 arranged back and forth in the vertical posture.

The lot processing section 6 includes a drying processing device 23 that performs a dry processing on the substrates 8, a substrate holder cleaning processing device 24 that performs a cleaning processing on the substrate holder 22, a cleaning processing device 25 that performs a cleaning processing on the substrates 8, and two etching processing devices 26 that perform an etching processing on the substrates 8.

The drying processing device 23 includes a processing tank 27 and a substrate elevating mechanism 28 in the processing tank 27. A processing gas for drying (e.g., isopropyl alcohol (IPA)) is supplied into the processing tank 27. In the elevating mechanism 28, a plurality of substrates 8 of one lot are held to be arranged back and forth in the vertical posture. The drying processing device 23 receives the lot from the substrate holder 22 of the lot conveying mechanism 19 using the substrate elevating mechanism 28, and elevates the lot using the substrate elevating mechanism 28 to perform a dry processing on the substrates 8 with the processing gas for drying supplied into the processing tank 27. In addition, the drying processing device 23 delivers the lot from the substrate elevating mechanism 28 to the substrate holder 22 of the lot conveying mechanism 19.

The substrate holder cleaning processing device 24 is able to supply a processing liquid for cleaning and a gas for drying into the processing tank 29. Accordingly, the substrate holder cleaning processing device 24 supplies the processing liquid for cleaning and then supplies the gas for drying onto the substrate holder 22 of the lot conveying mechanism 19, to thereby perform a cleaning processing on the substrate holder 22.

The cleaning processing device 25 includes a processing tank 30 for cleaning and a processing tank 31 for rinse. The processing tanks 30 and 31 include substrate elevating mechanisms 32 and 33, respectively. A processing liquid for cleaning such as SC-1 is stored in the processing tank 30 for cleaning. A processing liquid for rinse such as deionized water is stored in the processing tank 31 for rinse.

The etching processing device 26 includes a processing tank 34 for etching and a processing tank 35 for rinse. The processing tanks 34 and 35 include substrate elevating mechanisms 36 and 37, respectively. A processing liquid for etching such as a phosphoric acid aqueous solution is stored in the processing tank 34 for etching. A processing liquid for rinse such as deionized water is stored in the processing tank 35 for rinse.

The cleaning processing device 25 and the etching processing devices 26 have the same configuration as each other. Referring to the etching processing device 26, each of the substrate elevation mechanisms 36 and 37 holds a plurality of substrates 8 of one lot arranged back and forth in the vertical posture. The etching processing device 26 receives the lot from the substrate holder 22 of the lot conveying mechanism 19 using the substrate elevating mechanism 36, and elevates the lot using the substrate elevating mechanism 36 to immerse the lot in the processing liquid for etching in the processing tank 34, thereby performing the etching processing on the substrates 8. Then, the etching processing device 26 delivers the lot from the substrate elevating mechanism 36 to the substrate holder 22 of the lot conveying mechanism 19. In addition, the etching processing device 26 receives the lot from the substrate holder 22 of the lot conveying mechanism 19 using the substrate elevating mechanism 37, and elevates the lot using the substrate elevating mechanism 37 to immerse the lot in the processing liquid for rinse in the processing tank 35, thereby performing the rinse processing on the substrates 8. Then, the etching processing device 26 delivers the lot from the substrate elevating mechanism 37 to the substrate holder 22 of the lot conveying mechanism 19.

The etching processing device 26 performs a liquid processing (etching processing) by using an aqueous solution of a chemical liquid (phosphoric acid) at a predetermined concentration (88.3% by weight of a phosphoric acid aqueous solution) as the processing liquid (etching liquid).

Figure 2:
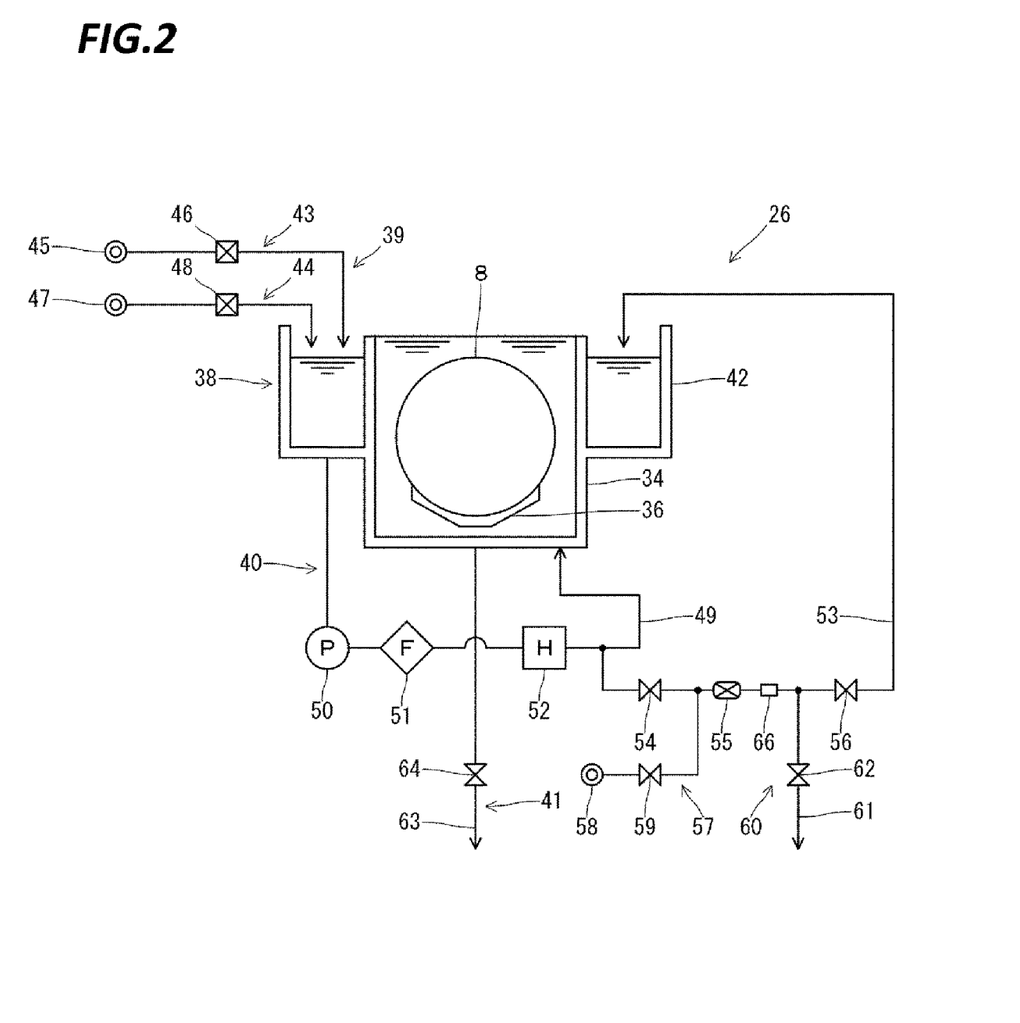
FIG. 2 is an explanatory view illustrating an etching processing device.

As illustrated in FIG. 2, the etching processing device 26 includes a processing liquid storing unit 38 that stores the phosphoric acid liquid at a predetermined concentration (88.3% by weight of the phosphoric acid liquid of) and processes the substrates 8 therein, a processing liquid supply unit 39 that supplies a processing liquid into the processing storing unit 38, a processing liquid circulation unit 40 that circulates the processing liquid stored in the processing liquid storing unit 38, and a processing liquid discharge unit 41 that discharges the processing liquid from the processing liquid storing unit 38.

The processing liquid storing unit 38 includes a top-opened processing tank 34 and a top-opened outer tank 42 around the upper portion of the processing tank 34, such that the processing liquid is stored in the processing tank 34 and the outer tank 42. The processing tank 34 stores the processing liquid in which the substrates 8 are immersed by the substrate elevating mechanism 36, thereby performing the liquid processing. The outer tank 42 stores the processing liquid that overflows from the processing tank 34, and supplies the processing liquid into the processing tank 34 by the processing liquid circulating unit 40.

The processing liquid supplying unit 39 includes an aqueous liquid supply unit 43 that supplies an aqueous solution of a chemical liquid (phosphoric acid) at a concentration (85% by weight of a phosphoric acid aqueous solution) different from (lower than) that of the processing liquid in the processing storing unit 38, and a water supply unit 44 that supplies water (deionized water) into the processing liquid storing unit 38.

In the aqueous solution supply unit 43, an aqueous solution source 45 is connected to the outer tank 42 of the processing liquid storing unit 38 via a flow rate adjuster 46. The aqueous solution source 45 supplies a phosphoric acid solution at a predetermined concentration (85% by weight) and a predetermined temperature (25° C.). The flow rate adjuster 46 is connected to the controller 7, and the controller 7 opens and closes the flow rate adjuster 46 to thereby control the flow rate.

In the water supply unit 44, a water source 47 is connected to the outer tank 42 of the processing liquid storing unit 38 via a flow rate adjuster 48. The water source 47 supplies deionized water at a predetermined temperature (25° C.). The flow rate adjuster 48 is connected to the controller 7, and the controller 7 opens and closes the flow rate adjuster 48 to thereby control the flow rate.

The processing liquid circulation unit 40 includes a circulation flow path 49 formed between the bottom of the outer tank 42 and the bottom of the processing tank 34 of the processing storing unit 38. The circulation flow path 49 includes a pump 50, a filter 51, and a heater 52 in this order. The pump 50 and the heater 52 are connected to the controller 7, and are driven by the controller 7. In addition, the processing circulation unit 40 drives the pump 50 to thereby circulate the processing liquid from the outer tank 42 to the processing tank 34. At this time, the processing liquid is heated up to a predetermined temperature (165° C.) by the heater 52.

In addition, the processing liquid circulation unit 40 includes a concentration measurement flow path 53 formed between a point in the middle of the circulation flow path 49 (a downstream side of the heater 52) and the outer tank 42. The concentration measurement flow path 53 includes an upstream opening/closing valve 54, a concentration sensor 55, a downstream opening/closing valve 56 in this order. A cleaning fluid supply unit 57 is connected between the upstream opening/closing valve 54 and the concentration sensor 55 to supply a cleaning fluid (deionized water at the room temperature in this exemplary embodiment) for cleaning the concentration sensor 55. In the cleaning fluid supply unit 57, a cleaning fluid source 58 for supplying a cleaning fluid is connected to a point between the upstream opening/closing valve 54 and the concentration sensor 55 via a supply opening/closing valve 59. In addition, a cleaning fluid discharging unit 60 for discharging a cleaning fluid is connected to a point between the concentration sensor 55 and the downstream opening/closing valve 56. In the cleaning fluid discharging unit 60, a discharge flow path 61 in communication with an external liquid drain pipe is connected to a point between the concentration sensor 55 and the downstream opening/closing valve 56, and a discharge opening/closing valve 62 is provided in the discharge flow path 61. The upstream opening/closing valve 54, the downstream opening/closing valve 56, the supply opening/closing valve 59, and the discharge opening/closing valve 62 are connected to the controller 7, and are opened/closed by the controller 7. In addition, the concentration sensor 55 is connected to the controller 7 to measure the concentration of the processing liquid flowing through the concentration measurement flow path 53 according to an instruction from the controller 7 and notify the measured concentration to the controller 7. The cleaning fluid discharge unit 60 discharges not only the cleaning fluid but also the processing liquid retained in the concentration measurement flow path 53.

In the cleaning liquid discharge unit 41, a liquid drain flow path 63 in communication with an external liquid drain pipe is connected to the bottom of the processing tank 34 of the processing liquid storing unit 38. An opening/closing valve 64 is provided in the liquid drain flow path 63. The opening/closing valve 64 is connected to the controller 7 and is opened and closed by the controller 7.

The controller 7 controls the operations of the respective parts of the substrate liquid processing apparatus 1 (the carrier carrying-in/out section 2, the lot forming section 3, the lot placing section 4, the lot conveying section 5, the lot processing section 6, and the like).

The controller 7 is, for example, a computer, and includes a computer-readable storage medium 65. The computer-readable storage medium 65 stores therein a program for controlling a variety of processings performed by the substrate liquid processing apparatus 1. The controller 7 controls the operations of the substrate liquid processing apparatus 1 by reading out and executing the program stored in the computer-readable storage medium 65. The program may be stored in the computer-readable storage medium 65 or may be received from another storage medium to be installed in the storage medium 65 of the controller 7. The computer-readable storage medium 65 includes, for example, a hard disk (HD), a flexible disk (FD), a compact disk (CD), a magnet optical disk (MO), and a memory card.

The substrate liquid processing apparatus 1 is configured as described above, and the controller 7 controls the operations of the respective parts (the carrier carrying-in/out section 2, the lot forming section 3, the lot placing section 4, the lot conveying section 5, the lot processing section 6, and the like) according to the substrate liquid processing program stored in the computer-readable storage medium 65, thereby processing the substrates 8.

In a case where the substrates 8 is subjected to an etching processing by the substrate liquid processing apparatus 1, a phosphoric acid aqueous solution at a predetermined concentration (85% by weight) and a predetermined temperature (25° C.) is supplied from the aqueous solution supply unit 43 of the etching processing device 26 into the processing liquid storing unit 38, and is heated by the processing liquid circulation unit 40 to thereby produce a processing liquid at a predetermined concentration (88.3% by weight) and a predetermined temperature (165° C.). The processing liquid is stored in the processing liquid storing unit 38. At that time, deionized water is supplied from the water supply unit 44 into the processing liquid storing unit 38 in an amount corresponding to an amount of water evaporated by the heating. Subsequently, the substrates 8 are immersed into the processing tank 34 in which the processing liquid at the predetermined concentration (88.3% by weight) and the predetermined temperature (165° C.) are stored by the substrate elevating mechanism 36, so that the substrates 8 is subject to the etching processing (liquid processing) with the processing liquid.

The substrate liquid processing apparatus 1 performs a liquid processing on the substrates 8 with a processing liquid while measuring the concentration of the processing liquid with the concentration sensor 55 as necessary. In addition, the concentration sensor 55 is cleaned with the cleaning fluid regularly.

Figure 3:
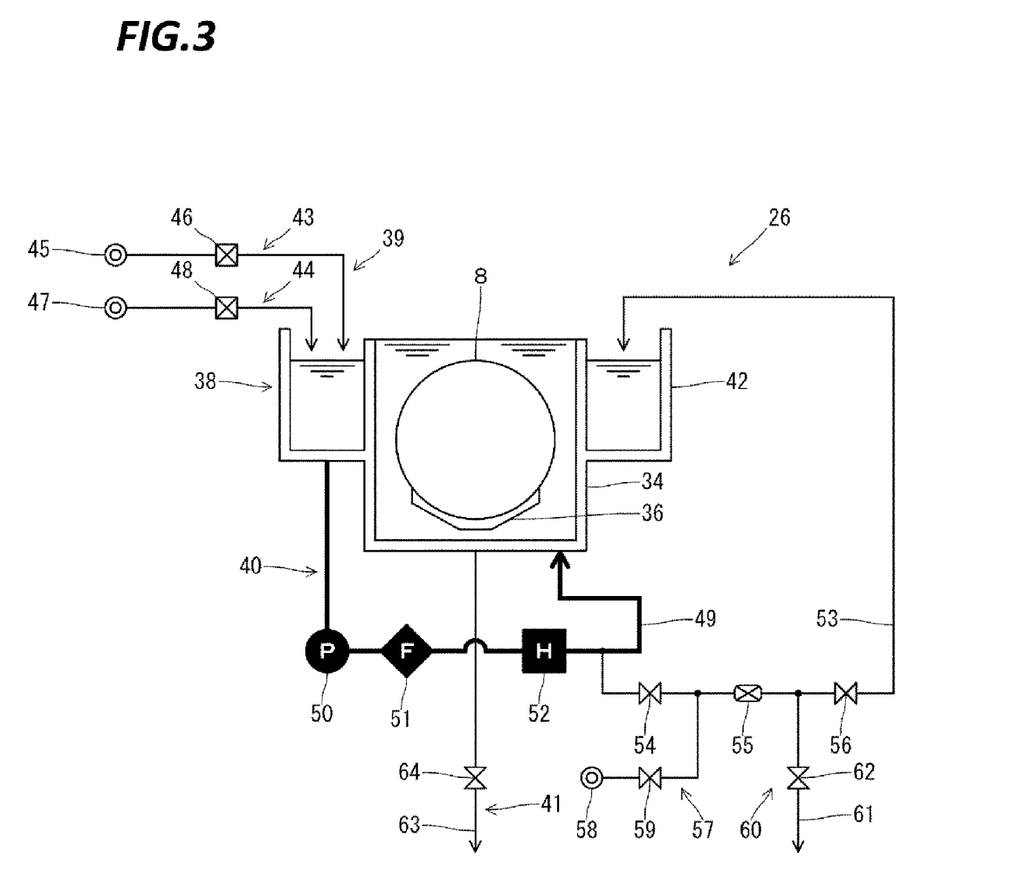
FIG. 3 is an explanatory view illustrating the etching processing device illustrated in FIG. 2 at the time of the liquid processing.

As illustrated in FIG. 3, during the liquid processing, the controller 7 drives the pump 50 to circulate the processing liquid through the circulation flow path 49, and drives the heater 52 to maintain the processing liquid at the predetermined temperature (165° C.).

Figure 4:
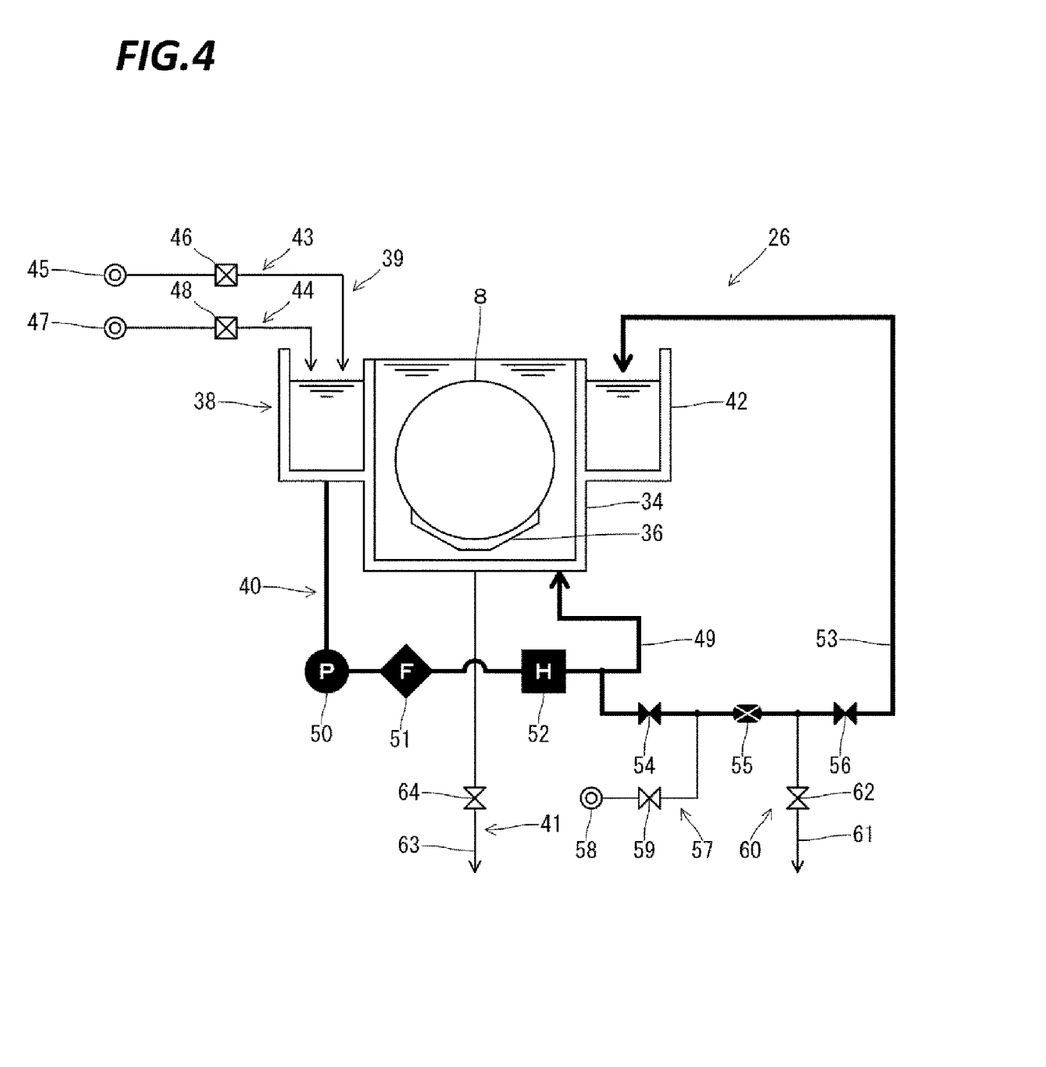
FIG. 4 is an explanatory view illustrating the etching processing device illustrated in FIG. 2 at the time of the concentration measurement.

As illustrated in FIG. 4, during the concentration measurement, similarly to the liquid processing, the controller 7 drives the pump 50 to circulate the processing liquid through the circulation flow path 49, and drives the heater 52 to maintain the processing liquid at the predetermined temperature (165° C.). In addition, the upstream opening/closing valve 54 and the downstream opening/closing valve 56 are opened to allow a part of the processing liquid flowing through the circulation flow path 49 to flow through the concentration measurement flow path 53, and the concentration of the processing liquid is measured by the concentration sensor 55.

Figure 5:
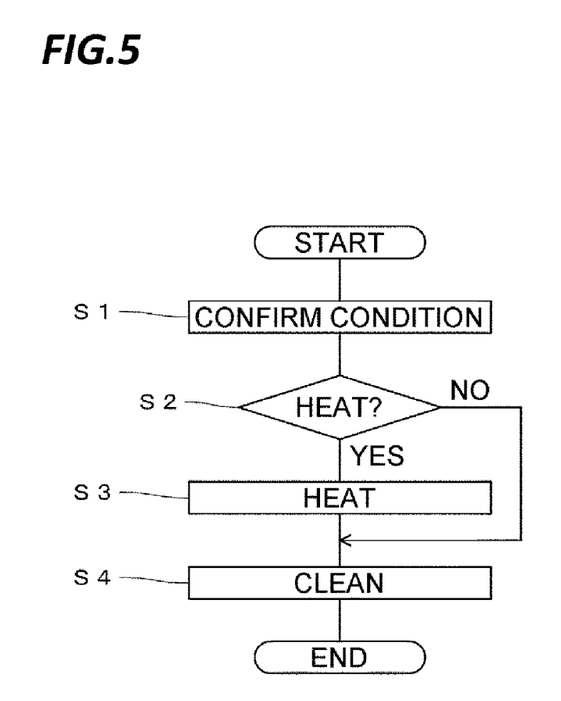
FIG. 5 is a flowchart illustrating a substrate liquid processing method.

During the cleaning of the concentration sensor 55, the controller 7 performs the cleaning operation of the concentration sensor 55 according to the substrate liquid processing program illustrated in FIG. 5.

Initially, the controller 7 confirms the conditions at the time of the cleaning operation (condition confirmation step S1). The conditions at the time of the cleaning operation refer to the criteria for determining whether to supply the cleaning fluid into the concentration sensor 55 to perform the cleaning after heating the processing liquid. For example, the conditions at the time of the cleaning operation may be set as a condition that the temperature of the processing liquid flowing through the concentration measurement flow path 53 measured by the temperature sensor 66 installed in the concentration measurement flow path 53 (see FIG. 2) is below a predetermined temperature (e.g., 100° C.). Alternatively, the conditions at the time of the cleaning operation may be set as a condition that the period of time for which the processing liquid is retained in the concentration measurement flow path 53 measured by a timer included in the controller 7 after the upstream opening/closing valve 54 or the downstream opening/closing valve 56 is closed is equal to or longer than a predetermined period of time (e.g., thirty minutes). Alternatively, without setting any particular cleaning condition, the cleaning fluid may be supplied into the concentration sensor 55 always after the processing liquid is heated, to thereby perform the cleaning.

Subsequently, the controller 7 determines whether to heat the processing liquid based on the conditions confirmed in the condition confirmation step S1 (e.g., the temperature or the retention time of the processing liquid) (heating determination step S2). When it is determined that the processing liquid needs to be heated, a subsequent heating step S3 is performed. When it is determined that the processing liquid does not need to be heated, the heating step S3 is skipped and a cleaning step S4 is performed. When the processing liquid needs to be unconditionally heated, the steps S1 and S2 may be omitted.

Figure 6:
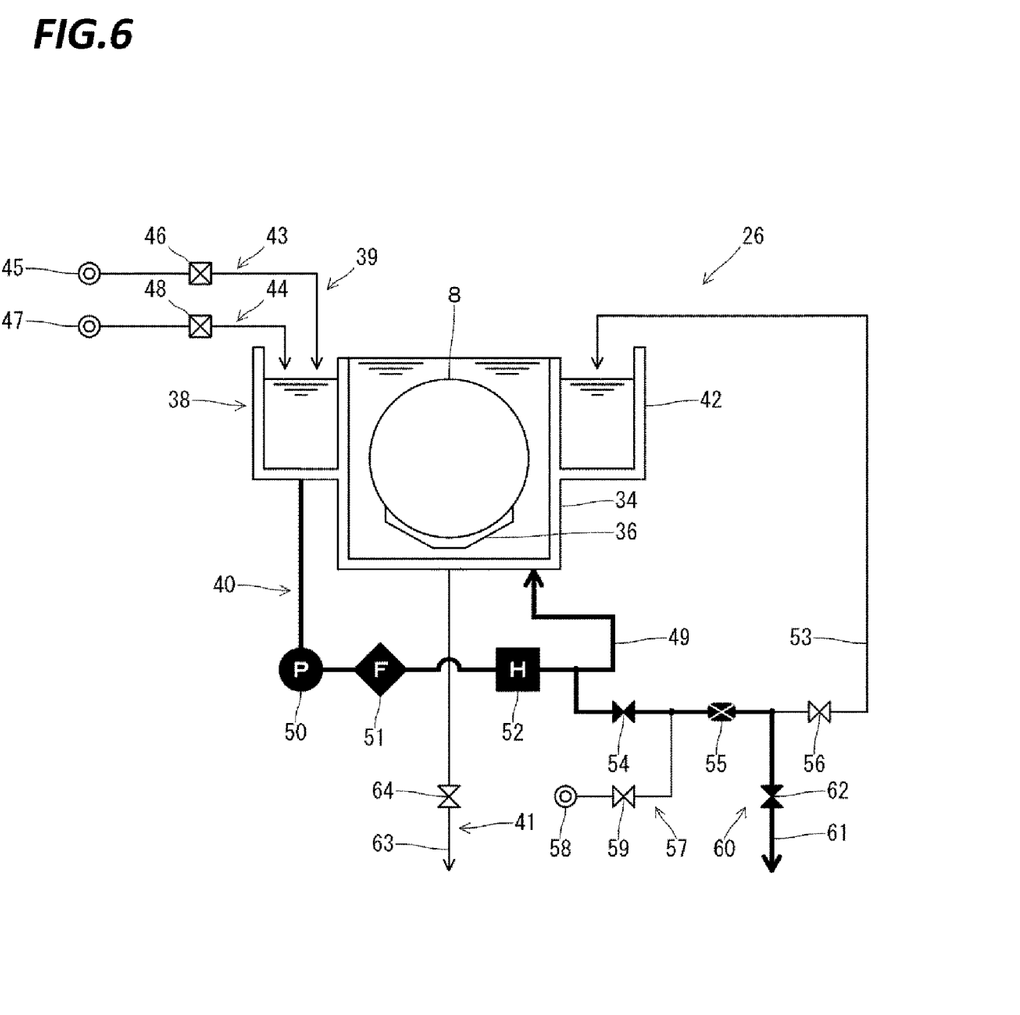
FIG. 6 is a view illustrating the etching processing device illustrated in FIG. 2 at the time of the heating.

As illustrated in FIG. 6, in the heating step S3, similarly to the liquid processing, the controller 7 drives the pump 50 to circulate the processing liquid through the circulation flow path 49, and drives the heater 52 to heat the temperature of the processing liquid to the predetermined temperature (165° C.). In addition, the upstream opening/closing valve 54 and the discharge opening/closing valve 62 are opened and the downstream opening/closing valve 56 is closed to allow a part of the processing liquid flowing through the circulation flow path 49 heated to a predetermined temperature to flow the concentration measurement flow path 53, such that the processing liquid passes through the concentration sensor 55 and is then discharged via the discharge flow path 61. The heating step S3 is continuously performed for a predetermined period of time (e.g., twelve seconds).

Figure 7:
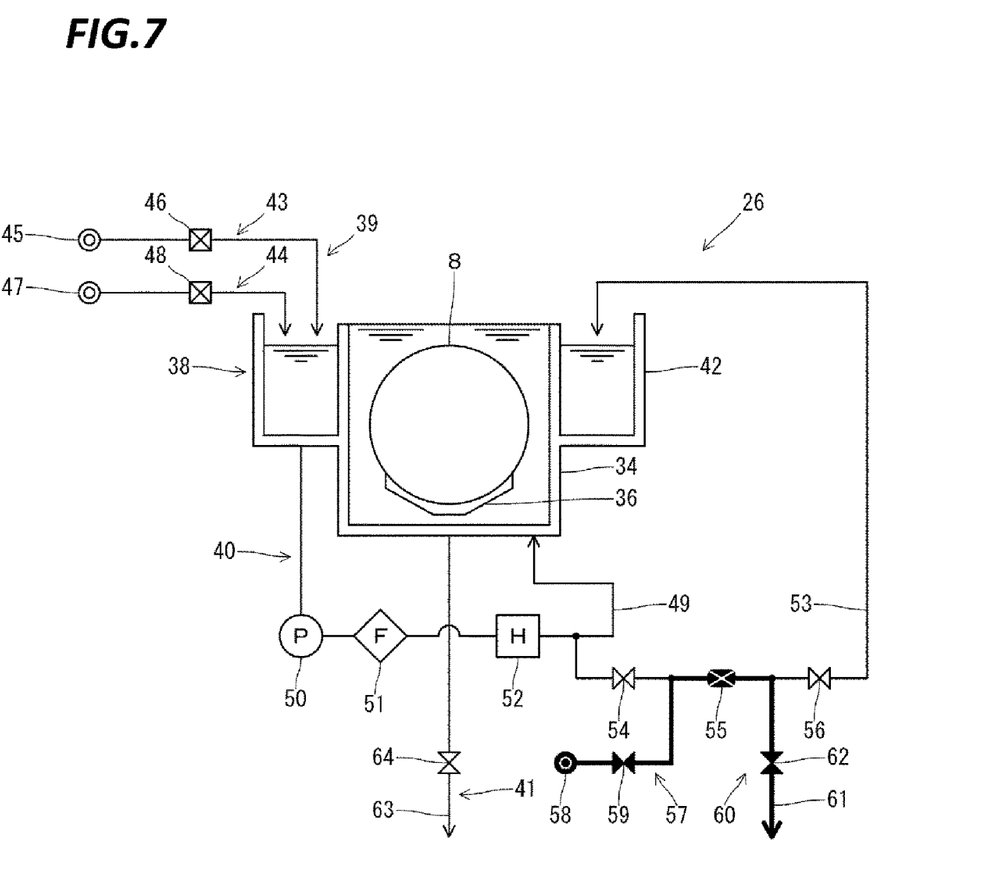
FIG. 7 is a view illustrating the etching processing device illustrated in FIG. 2 at the time of the cleaning.

In the cleaning step S4, as illustrated in FIG. 7, the controller 7 closes the upstream opening/closing valve 54 and the downstream opening/closing valve 56 and opens the supply opening/closing valve 59 and the discharge opening/closing valve 62, such that the cleaning fluid is supplied from the cleaning fluid source 58, passes through the concentration sensor 55, and then is discharged from the discharge flow path 61. By doing so, the liquid contact portion of the concentration sensor 55 is cleaned with the cleaning fluid.

In the cleaning step S4, the processing liquid initially flows to the cleaning fluid. At that time, the cleaning fluid comes in contact with the processing liquid. When the temperature of the processing liquid is below a predetermined temperature (e.g., 80° C.), crystals may be produced because reaction takes place as the processing liquid comes in contact with the cleaning fluid. However, the crystallization may be suppressed by heating the processing liquid to a temperature higher than the temperature at which crystallization is caused by the reaction between the processing liquid and the cleaning fluid such that no reaction takes place in step S4 even if the processing liquid comes in contact with the cleaning fluid.

As described above, the substrate liquid processing program causes the heating step S3 to be performed prior to the cleaning step S4, such that the processing liquid is heated to a temperature higher than the temperature at which crystallization is caused by the reaction between the processing liquid and the cleaning fluid. In the heating step S3, instead of heating the processing liquid to a temperature higher than the temperature at which crystallization is caused (e.g., 80° C.), the processing liquid may be heated to the temperature equal to that of the processing liquid at the time of processing the substrates 8 (e.g., 165° C.), thereby facilitating, for example, easy control of the heater 52. In the heating step S4, the processing liquid retained in the flow path through which the cleaning fluid flows is heated, but not limited thereto. In the step S3, the cleaning fluid may be heated or the flow path (pipe) itself through which the cleaning fluid flows may be heated to in turn heat the processing liquid or the cleaning fluid. When the heated processing liquid is allowed to flow, the existing heater 52, which is used in heating the processing liquid for processing the substrates 8, may be used. Therefore, it is not required to install any additional dedicated heater.

As described above, according to the substrate liquid processing apparatus 1 and the substrate liquid processing method (substrate liquid processing program) used in the substrate liquid processing apparatus 1, the processing liquid is heated by the heater 52 to the temperature higher than the temperature at which crystallization is caused by the reaction between the processing liquid and the cleaning fluid before the cleaning fluid is supplied into the processing liquid flow path through which the processing liquid flows from the cleaning fluid supply unit 57 (the concentration measurement flow path 53 in this exemplary embodiment). By doing so, the crystallization may be suppressed from being caused by the reaction between the processing liquid and the cleaning fluid at the time of cleaning the processing liquid flow path through which the processing liquid flows (the concentration measurement flow path 53 in this exemplary embodiment) with the cleaning fluid. As a result, it is possible to prevent failures such as blockage of the pipe, an erroneous operation of the concentration sensor 55 or attachment on the substrates 8 resulted from the crystallization, so that the liquid processing on the substrates 8 can be sufficiently performed.

In the substrate liquid processing apparatus 1, the present disclosure has been applied to the concentration measurement flow path 53 as a processing liquid flow path through which the processing liquid flows, but not limited thereto. In other exemplary embodiments of the present disclosure, the cleaning fluid supply unit 57 may be installed in a flow path through which the processing liquid flows such as, for example, the circulation flow path 49 or the liquid drain flow path 63.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims

What is claimed is:
1. A substrate liquid processing apparatus comprising:
a processing liquid flow path including a concentration sensor through which a processing liquid for processing a substrate flows;
a cleaning fluid supply source connected to the processing liquid flow path through a cleaning fluid supply path including a first valve, and configured to supply a cleaning fluid to the processing liquid flow path to thereby clean at least a part of the processing liquid flow path including the concentration sensor;
a heater configured to heat the processing liquid;
a second valve provided at an upstream side of the concentration sensor;
a third valve provided at a downstream side of the concentration sensor;
a discharge path connected between the concentration sensor and the third valve, and including a fourth valve;
a timer configured to measure a period of time for which the processing liquid is retained in the part of the processing liquid flow path including the concentration sensor; and
a controller configured to control the cleaning fluid supply source, the heater, the first valve through the fourth valve, and the timer;
wherein the controller is programmed to:
control the timer to measure the period of time for which the processing liquid is retained in the part of the processing liquid flow path including the concentration sensor while the first valve, the fourth valve, and at least one of the second valve and the third valve, are being closed by the controller;
determining if the period of time measured by the timer is longer than a predetermined period of time, and if so, proceeding to 1) control the heater to heat the processing liquid to a temperature higher than a crystallization temperature at which a reaction between the processing liquid and the cleaning fluid resulting in crystallization occurs, and 2) control the first valve and the third valve to be closed and control the second valve and the fourth valve to be opened such that at least a part of the heated processing liquid is supplied to the part of the processing liquid flow path including the concentration sensor in which the processing liquid is retained, and discharged from the discharge path after passing through the concentration sensor; and
after the determining, control the first valve of the cleaning fluid supply path to be opened in order for the cleaning fluid supply source to supply the cleaning fluid to the part of the processing liquid flow path including the concentration sensor such that the part of the processing liquid supply path including the concentration sensor is cleaned by the cleaning fluid without causing crystallization.
2. The substrate liquid processing apparatus of claim 1, wherein the controller controls the heater to heat the processing liquid to a temperature for processing the substrate.

3. The substrate liquid processing apparatus of claim 1, wherein the processing liquid flow path includes:
- a circulation path of which both ends being connected to a processing liquid storage tank that stores the processing liquid, the circulation path including a pump and the heater, and the circulation path being configured to circulate the processing liquid therethrough, and
- a concentration measurement path that is the part of the processing liquid flow path including the concentration sensor configured to measure a concentration of the processing liquid, and branched from the circulation path.

4. The substrate liquid processing apparatus of claim 3, wherein the cleaning fluid supply source is connected to the concentration measurement path at a position between the second valve and the concentration sensor through the cleaning fluid supply path.

5. The substrate liquid processing apparatus of claim 1, wherein the crystallization temperature is 80° C.

* * * * *